United States Patent
Watanabe et al.

(10) Patent No.: US 8,278,961 B2
(45) Date of Patent: Oct. 2, 2012

(54) TEST APPARATUS AND TEST METHOD

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 124 days.

(21) Appl. No.: 12/605,965

(22) Filed: Oct. 26, 2009

(65) Prior Publication Data
US 2010/0308856 A1 Dec. 9, 2010

Related U.S. Application Data

(63) Continuation of application No. PCT/JP2008/057709, filed on Apr. 21, 2008.

(30) Foreign Application Priority Data

Apr. 27, 2007 (JP) ................................ 2007-119174

(51) Int. Cl.
G01R 31/02 (2006.01)
G01R 31/28 (2006.01)

(52) U.S. Cl. .............. 324/762.01; 324/762.02; 714/735; 714/736

(58) Field of Classification Search ............ 324/762.01–762.06; 714/735–736
See application file for complete search history.

(56) References Cited

U.S. PATENT DOCUMENTS

| 5,001,726 | A  | * | 3/1991 | Kawai et al. | .................. | 375/317 |
| 6,476,628 | B1 |   | 11/2002 | LeColst |  |  |
| 6,789,224 | B2 | * | 9/2004 | Miura | ............................ | 714/744 |
| 7,103,815 | B2 | * | 9/2006 | Ong et al. | ..................... | 714/736 |
| 7,228,248 | B2 | * | 6/2007 | Ochi et al. | ..................... | 702/108 |
| 7,398,169 | B2 | * | 7/2008 | Yamaguchi et al. | ............ | 702/69 |
| 7,965,093 | B2 | * | 6/2011 | Baba et al. | ............... | 324/762.01 |

(Continued)

FOREIGN PATENT DOCUMENTS

JP 6-237231 A 8/1994

(Continued)

OTHER PUBLICATIONS

Taiwanese Office Action dated Oct. 4, 2011, in a counterpart Taiwanese patent application No. 097115061, citing US6789224 which has been referenced by a US Examiner in a PTO-892 form, and US2007/0018637 and Foreign Patent document JP6-237231 which have been submitted in a previous IDS.

(Continued)

Primary Examiner — Joshua Benitez Rosario
(74) Attorney, Agent, or Firm — Chen Yoshimura LLP

(57) ABSTRACT

Provided is a test apparatus for testing a device under test, including: a level comparing section that receives a signal under test output from the device under test and outputs a logical value, the logical value indicating a comparison result obtained by comparing a signal level of the signal under test with preset first threshold and second threshold; an acquiring section that acquires the logical value output from the level comparing section, according to a strobe signal supplied thereto; an expected value comparing circuit that determines whether the logical value acquired by the acquiring section corresponds to a preset expected value; and a threshold control section that sets an upper limit and a lower limit of a voltage of the eye mask to the level comparing section as the first threshold and the second threshold, when an eye mask test is performed for determining whether an eye opening of the signal under test is larger than a predefined eye mask.

15 Claims, 9 Drawing Sheets

U.S. PATENT DOCUMENTS

| | | | |
|---|---|---|---|
| 8,001,439 B2 * | 8/2011 | Ong | 714/742 |
| 2005/0218881 A1 | 10/2005 | Tanaka et al. | |
| 2005/0219937 A1 | 10/2005 | Sato | |
| 2006/0069971 A1 * | 3/2006 | Waschura et al. | 714/724 |
| 2007/0018637 A1 * | 1/2007 | Kim et al. | 324/158.1 |
| 2009/0048796 A1 * | 2/2009 | Yamamoto et al. | 702/69 |
| 2009/0072866 A1 * | 3/2009 | Walker | 327/62 |

FOREIGN PATENT DOCUMENTS

| | | |
|---|---|---|
| JP | 2000-295298 A | 10/2000 |
| JP | 2001-144819 A | 5/2001 |
| JP | 2003-315414 A | 11/2003 |
| JP | 2004-125552 A | 4/2004 |
| JP | 2004-125573 A | 4/2004 |
| JP | 2005-156328 A | 6/2005 |
| JP | 2007-33451 A | 2/2007 |

OTHER PUBLICATIONS

International Search Report (ISR) for PCT/JP2008/057709 for Examiner consideration, citing U.S. Patent Application Publication Nos. 1-3, and Foreign Patent Document Nos. 1-7 listed above, Jul. 8, 2008.

Written Opinion (PCT/ISA/237) of PCT/JP2008/057709, Jul. 8, 2008.

* cited by examiner

TEST APPARATUS AND TEST METHOD

BACKGROUND

1. Technical Field

The present invention relates to a test apparatus and a test method for testing a device under test. More specifically, the present invention relates to a test apparatus and a test method for testing an degree of eye opening of a signal which is output from the device under test.

2. Related Art

A test of a quality of output waveforms is one item in tests for a device under test such as a semiconductor chip. For example, such test may be performed by causing the device under test to output a pseudo random pattern to measure the degree of eye opening of an eye diagram of an output signal. In order to measure the degree of eye opening in a timing direction, jitter of the edge of the output signal is measured, meanwhile a mask test is performed in order to measure the degrees of eye opening both in the direction of timing and in the direction of voltage level.

The mask test is to measure whether all waveform data of the output signal exist outside an eye mask, supposing that the eye mask according to the quality requirement is located at the center of the eye diagram. For example, the eye mask is often defined as the standard of an interface. Therefore, when mask tests are applied to a mass production test, it is preferred that they are performed with multichannel in parallel and performed in a short period of time.

Conventionally, the application for performing mask tests is incorporated in a separate measuring device. For example, some sampling oscilloscopes may include application software for the mask test. In addition, such as a time interval analyzer may be provided with the application software for the mask rest. Here, the following document discloses prior art for measuring the eye opening.

Patent document 1: Japanese Patent Application Publication No. 2000-295298

However, it is difficult to perform mask tests for the mass production test by an apparatus in which the separate measuring device, such as the sampling oscilloscope and the time interval analyzer is provided with the software for the mask test. For example, when measuring with the multichannel, many oscilloscopes may be required, therefore, it is difficult to implement the measuring device with the multichannel in a high density.

Moreover, a process to store the measured signal waveforms in a memory and to determine whether all the signal waveform data exist outside the eye mask is performed by such as a processor in general, however, the processor may not process in less time. In addition, since the signal waveforms are measured by equivalent sampling, it takes a long time to measure the signal waveforms. Moreover, when the signal waveforms are under-sampled, the dead band in the measurement occurs. Furthermore, it is required that the phase of a strobe signal that defines a sampling timing is gradually changed and scanned.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, provided is a test apparatus that tests a device under test. The test apparatus includes: a level comparing section that receives a signal under test output from the device under test and outputs a logical value, the logical value indicating a comparison result obtained by comparing a signal level of the signal under test with preset first threshold and second threshold; an acquiring section that acquires the logical value output from the level comparing section, according to a strobe signal supplied thereto; an expected value comparing circuit that determines whether the logical value acquired by the acquiring section corresponds to a preset expected value; and a threshold control section that sets an upper limit and a lower limit of a voltage of the eye mask to the level comparing section as the first threshold and the second threshold, when an eye mask test is performed for determining whether an eye opening of the signal under test is larger than a predefined eye mask. A test method relating to the above test apparatus is also provided.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
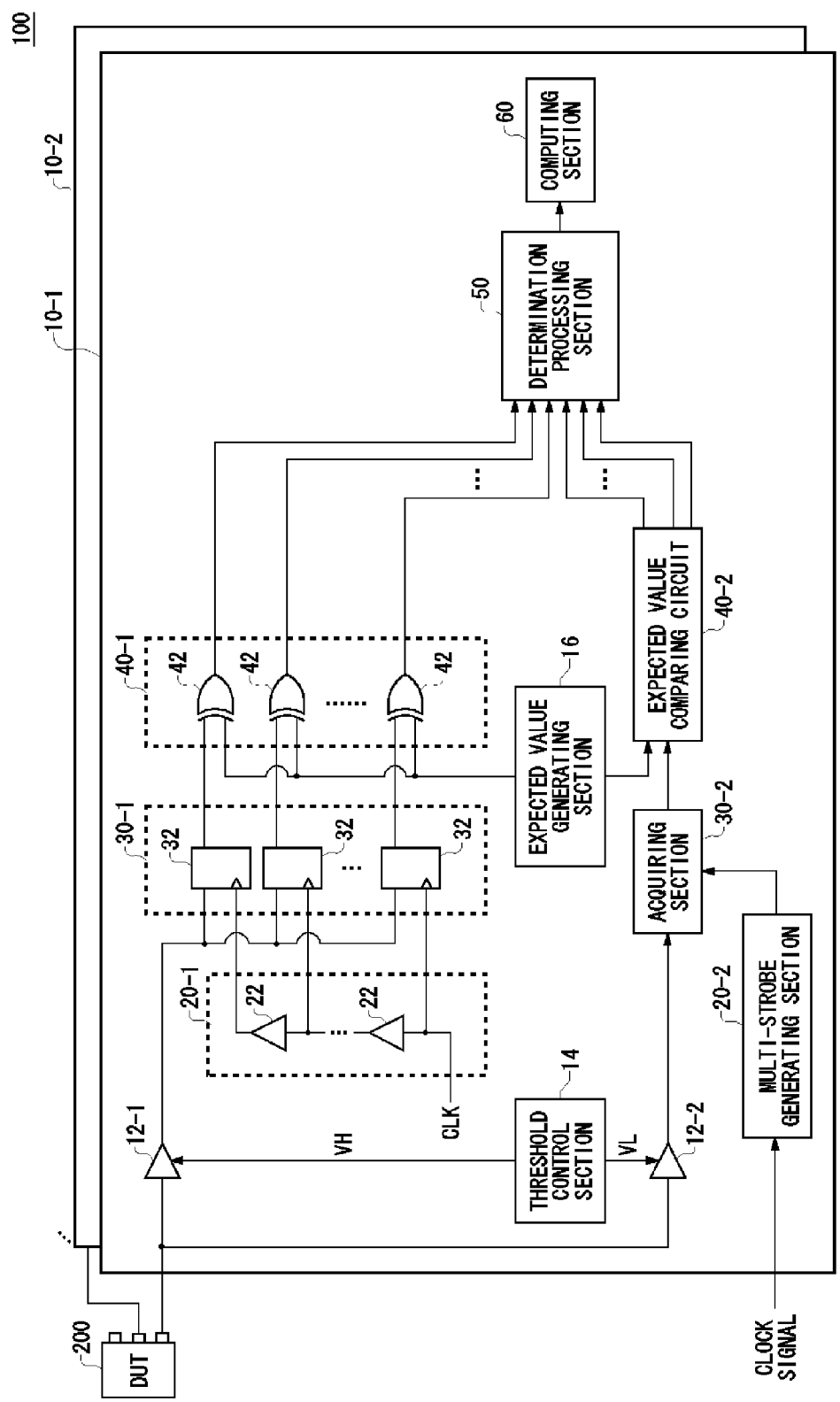
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 200 such as a semiconductor chip and has a plurality of measuring units 10. A signal under test output from the device under test 200 is input to each of the measuring units 10, and the measuring unit 10 measures the eye opening of the signal under test.

The measuring unit 10 according to the present embodiment generates a multi-strobe described later for each cycle of the signal under test to remove the dead band in the measurement without changing and scanning the phase of a strobe signal. That is, the measuring unit 10 generates a plurality of strobe signals (multi-strobe) with different phases, instead of the conventional processing such as scanning the phase of the strobe signal and sampling the signal under test at a plurality of timings. In addition, the measuring unit 10 generates the multi-strobe for each cycle of the signal under test and oversamples the signal under test to remove the dead band in the measurement.

Moreover, each of the measuring units 10 has a hardware that measures the signal under test (e.g. level comparing section 12), so that the plurality of measuring units 10 measure signals at the same time. For example, a signal under test output from each different pin of the device under test 200 may be input to each measuring unit 10. Otherwise, the signal under test output from another device under test 200 may be input to each measuring unit 10. Each measuring unit 10 has the same function and configuration, and measures each signal under test input thereto in parallel. That is, the test apparatus 100 can measure eye openings of the plurality of signals under test at the same time.

Moreover, the test apparatus 100 may has a function to perform a functional test and a jitter test for the device under test 200. For example, when performing the functional test for the device under test 200, the test apparatus 100 may further include a test signal input section that inputs a test signal having a predetermined logic pattern to the device under test 200. In this case, each measuring unit 10 measures the logic pattern of the signal under test output from the device under test 200 in response to the test signal, and compares the measured logic pattern with an expected value pattern. The test apparatus 100 may be configured as a general test apparatus that performs a functional test. In addition, the test apparatus 100 may measure the eye opening of the signal under test by using the measuring unit 10 which is provided in the test apparatus that performs the functional test. Since the test apparatus that performs the functional test has generally has many measuring units 10 in parallel, it can measure the eye openings of many signals under test in parallel.

Each measuring unit 10 may have the level comparing section 12, a threshold control section 14, an expected value generating section 16, a multi-strobe generating section 20, an acquiring section 30, an expected value comparing circuit 40, a determination processing section 50 and a computing section 60. Here, at least the determination processing section 50 and the computing section 60 may be shared by the plurality of the measuring units 10.

The level comparing section 12 receives the signal under test output from the device under test 200 and outputs a logical value indicating a comparison result obtained by comparing the signal level of the signal under test with a preset threshold. The measuring unit 10 has a plurality of level comparing sections 12 into which split signals under test is input, and the entire level comparing sections 12 compare multiple thresholds with the signal level of the signal under test.

In the present embodiment, the measuring unit 10 has a first level comparing section 12-1 and a second level comparing section 12-2. The first level comparing section 12-1 compares a first threshold VH with the signal level of the signal under test. For example, the first level comparing section 12-1 outputs logical value H when the signal level of the signal under test is equal to or more than the first threshold VH, and outputs logical value L when the signal level of the signal under test is equal to or less than the first threshold VH.

Meanwhile, the second level comparing section 12-2 compares a second threshold VL with the signal level of the signal under test. For example, the second level comparing section 12-2 outputs logical value H when the signal level of the signal under test is equal to or less than the second threshold value VL, and outputs logical value L when the signal level of the signal under test is equal to or more than the second threshold VL. By such arrangement, the entire level comparing sections 12 can obtain outputs indicating three values for case 1 where the signal level of the signal under test is equal to or more than the first threshold VH; case 2 where the signal level of the signal under test is less than the first threshold VH and equal to or more than the second threshold VL; and case 3 where the signal level of the signal under test is less than the second threshold VL. Here, the first threshold VH should be more than the second threshold VL.

Moreover, each measuring unit 10 has the acquiring section 30 and the expected value comparing circuit 40 for each of the level comparing sections 12. The multi-strobe generating section 20 may be shared by each level comparing section 12. In this case, the same multi-strobe is supplied to each level comparing section 12. In addition, each of a plurality of multi-strobe generating sections 20 may be provided in each of the level comparing sections 12. In this case, each multi-strobe generating section 20 may generate the same multi-strobe.

The multi-strobe generating section 20 generates, for each cycle of the signal under test, a multi-strobe composed of a plurality of strobe signals with different phases. The multi-strobe generating section 20 may generate a plurality of strobe signals which are disposed at even intervals in the direction of time, and may generate the plurality of strobe signals which are disposed at certain intervals each randomly set. The cycle of the signal under test may be an interval over which information of one symbol is transmitted in the signal under test.

The multi-strobe generating section 20 according to the present embodiment has a plurality of delay elements 22 which are cascade-connected. The multi-strobe generating section can sequentially delay clock signals supplied thereto by using the plurality of delay elements 22 and extract an output of each delay element 22 as each strobe signal to generate the plurality of strobe signals with the different phases.

An amount of delay for each delay element 22 may be the same. In this case, a plurality of strobe signals disposed at even intervals can be generated. In addition, the multi-strobe generating section 20 may further include an adjusting section that adjusts the amount of delay for each delay element 22 according to the interval suitable for each strobe signal. Thereby the interval for each strobe signal may be arbitrarily set.

Moreover, the multi-strobe generating section 20 may have the number of delay elements 22 corresponding to the number of strobe signals to be generated per cycle of the signal under test. In addition, the clock signal may be a signal having a pulse at a period approximately equal to one cycle of the signal under test, for example. Moreover, a test rate signal which defines the operating cycle of the test apparatus 100 may be used as the clock signal. Furthermore, the test apparatus 100 may operate according to the test rate signal and input to the device under test 200 a test signal having approximately the same cycle as that of the test rate signal, so that the device under test 200 may output a signal under test having approximately the same cycle as that of the test rate signal.

Thereby the number of strobe signals corresponding to the number of delay elements 22 can be generated per cycle of the signal under test.

The acquiring section 30 acquires the logical value output from the level comparing section 12 according to the strobe signal supplied thereto. The multi-strobe generating section 20 supplies a multi-strobe to the acquiring section 30. The acquiring section 30 acquires the logical value output from the level comparing section 12 at a timing according to each strobe signal contained in the multi-strobe.

The acquiring section 30 according to the present embodiment has a plurality of flip-flops 32 which are arranged in parallel. The plurality of flip-flops 32 correspond one-on-one to a plurality of strobe signals output from the multi-strobe generating section 20 per cycle of the signal under test. The logical value output from the level comparing section 12 is split and input to each flip-flop 32, and each flip-flop 32 acquires the logical value at the timing of the corresponding strobe signal.

The expected value comparing circuit 40 determines whether the logical value acquired by the acquiring section 30 corresponds to a preset expected value. For example, the expected value comparing circuit 40 receives an expected value for each cycle of the signal under test, and compares the expected value with the plurality of logical value which are acquired by the acquiring section 30 for this cycle.

The expected value comparing circuit 40 according to the present embodiment has a plurality of exclusive OR circuits 42 arranged such that the plurality of exclusive OR circuits 42 correspond one-to-one to the plurality of flip-flops 32. Each of the exclusive OR circuits 42 outputs an exclusive OR between the logical value acquired by the corresponding flip-flop 32 and the expected value provided from the expected value generating section 16. That is, each exclusive OR circuit 42 outputs logical value 0 when the logical value corresponds to the expected value, and outputs logical value 1 when the logical value does not correspond to the expected value. The expected value output from the expected value generating section 16 for each cycle of the signal under test may be split and supplied to each exclusive OR circuit 42.

The determination processing section 50 and the computing section 60 determine pass/fail of the device under test 200 based on a comparison result output from each of the expected value comparing circuit 40. By such arrangement, the test apparatus 100 can perform test such as the functional test and the eye mask test on the device under test 200.

The threshold control section 14 controls the threshold set for each level comparing section 12. For example, when the test apparatus 100 performs the functional test on the device under test 200, the threshold control section 14 sets in the first level comparing section 12-1 a voltage level which defines H level of the signal under test as the first threshold VH. Meanwhile, the threshold control section 12 sets to the second level comparing section 12-2 a voltage level which defines L level of the signal under test as the second threshold VL. The H level of the signal under test may be a voltage level slightly less than the voltage level when the signal under test indicates logical value H, for example. Meanwhile, the L level of the signal under test may be a voltage level slightly less than the voltage level when the signal under test indicates logical value L, for example.

Thus, each level comparing section 12 can detect the logical values of the signal under test. Then, the acquiring section 30 acquires the logical value of the signal under test at a predetermined timing. In addition, the expected value comparing circuit 40 compares the logical value with a predetermined expected value. When the test apparatus 100 performs the functional test on the device under test 200, the expected value generating section 16 outputs the logical value to be indicated for each cycle of the signal under test as an expected value per cycle of the signal under test. The expected value may be generated from the logic pattern of a test signal input to the device under test 200.

Then, the determination processing section 50 and the computing section 60 determine pass/fail of the device under test 200, based on the comparison result output from the expected value comparing circuit 40. For example, the determination processing section 50 and the computing section 60 generates an OR of the comparison result output from the expected value comparing circuit 40, and may determine that the device under test 200 is not defective when the OR indicates logical value 0. Thus, the test apparatus 100 can perform the functional test on the device under test 200. In addition, when the test apparatus 100 performs the functional test on the device under test 200, the multi-strobe generating section 20 may generate one strobe signal placed at substantially the center of the cycle, for each cycle of the signal under test. Alternatively, the multi-strobe generating section 20 may generate a plurality of strobe signals for each cycle, and the determination processing section 50 may extract an output of the exclusive OR circuit 42 corresponding to the strobe signal which is placed at substantially the center of the cycle.

On the other hand, when the test apparatus 100 performs the eye mask test for measuring a degree of eye opening of the signal under test, the threshold control section 14 sets in the first level comparing section 12-1 the upper limit of a predefined voltage of the eye mask as the first threshold VH. Meanwhile, the threshold control section 14 sets in the second level comparing section 12-2 the lower limit of the voltage of the eye mask as the second threshold VL. Here, the eye mask may define the size of eye opening, for at least the eye diagram of the signal under test.

Thus, a signal indicating whether the signal level of the signal under test at each time satisfies the definition of the upper and lower limits of the eye mask in the direction of voltage can be generated. Then, the acquiring section 30 acquires the logical value of the generated signal at a predetermined timing. Thereby the test apparatus 100 can detect, for each cycle of the signal under test, whether the signal levels of the signal under test at the plurality of timings which are defined by the multi-strobe satisfy the definition of the eye mask in the direction of voltage.

Here, the values to be set in the level comparing section 12 as the first threshold and the second threshold for the functional test, and the values to be set in the level comparing section 12 as the first threshold and the second threshold for the eye mask test may be preset by such as a user. The threshold control section 14 holds each value which is preset by the user, and preferably set the corresponding threshold value in the level comparing section 12, based on which of the functional test or the eye mask test is performed.

Figure 2A:
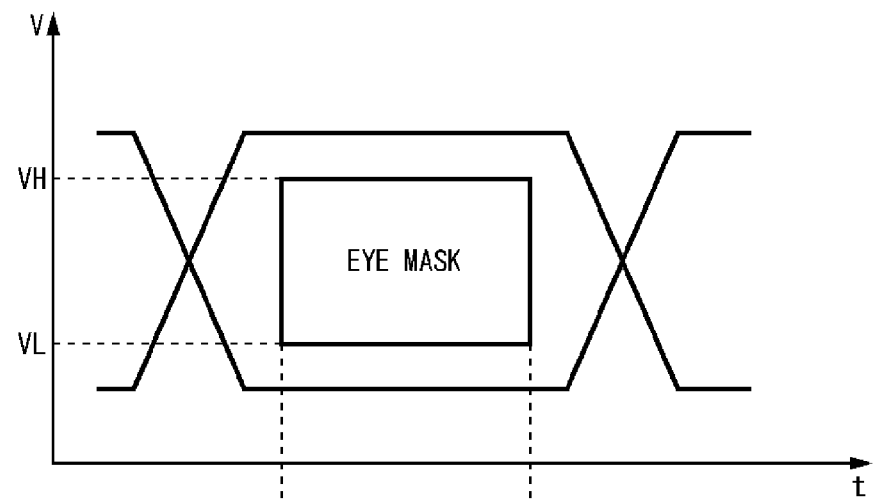
FIG. 2A shows an exemplary eye diagram of a signal under test.

FIG. 2A shows an exemplary eye diagram of the signal under test. The eye diagram of the signal under test may be obtained by superimposing the waveform for each cycle of the signal under test, for example. In the eye mask test, the test apparatus determines whether the opening of the eye diagram of the signal under test is larger than the eye mask. The opening of the eye diagram refers to a region in which there is no waveform of the signal under test for all cycle of the measured signal under test.

For example, when a waveform for at least one cycle of the signal under test is inside the eye mask, it can be determined that the opening of the eye diagram is smaller than the eye mask. That is, when there is any waveform which does not satisfy the definition in the direction of voltage within the eye diagram in the direction of time, which is defined by the eye mask, it can be determined that the opening of the eye diagram is smaller than the eye mask.

Figure 2B:
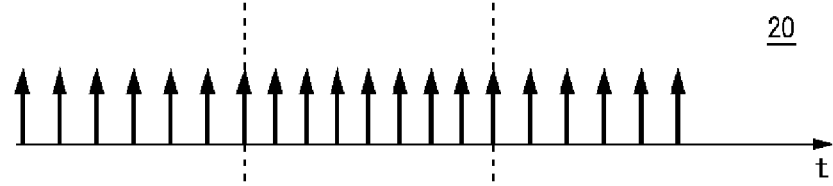
FIG. 2B shows an exemplary multi-strobe.

FIG. 2B shows an exemplary multi-strobe. The multi-strobe generating section 20 according to the present embodiment generates strobe signals arranged at even intervals in the direction of time over the cycles of the signal under test. As described above, the test apparatus can determine whether the eye opening of the signal under test is lager than the eye mask by determining whether the signal under test satisfies the definition in the direction of voltage at the timing of each strobe signal within the direction of time, which is defined by the eye mask.

As described above, the test apparatus 100 sets the upper limit and the lower limit of the eye mask in the direction of voltage as the first threshold value VH and the second threshold value VL. Then, the acquiring section 30 acquires, for each cycle of the signal under test, the logical value output from the level comparing section 12 at the timings of the plurality of strobe signals constituting the multi-strobe. Then, the expected value comparing circuit 40 compares each logical value with the expected value, e.g. logical value H. In the eye mask test on the signal under test, the expected value comparing circuit 40 may generate the same expected value for all the cycles of the signal under test.

At this time, when, among the exclusive OR circuits 42 included in the first expected value comparing circuit 40, all the exclusive OR circuits 42 corresponding to the strobe signals inside the eye mask output PASS (logical value 0), the waveform of the signal under test for this cycle exists above the eye mask. Meanwhile, when, among the exclusive OR circuits 42 included in the second expected value comparing circuit 40, all the exclusive OR circuits 42 corresponding to the strobe signals inside the eye mask output PASS, the waveform of the signal under test for this cycle exists below the eye mask.

The determination processing section 50 may generate, for each cycle of the signal under test, an OR of the logical values output from the exclusive OR circuits 42 corresponding to the strobe signals inside the eye mask in the first expected value comparing circuit 40-1 (hereinafter referred to as the first OR). Meanwhile, the determination processing section 50 may generate, for each cycle of the signal under test, an OR of the logical values output from the exclusive OR circuits 42 corresponding to the strobe signals inside the eye mask in the second expected value comparing circuit 40-2 (hereinafter referred to as the second OR). The determination processing section 50 may have an OR circuit that generates the above-mentioned ORs.

Then, when the first OR or the second OR indicates logical value 0 for each cycle of the signal under test, the determination processing section 50 may determine that the waveform of the signal under test for this cycle exists outside the eye mask. For example, the determination processing section 50 may have an OR circuit that further generates an OR of the first OR and the second OR (hereinafter referred to as the third OR), corresponding to each cycle of the signal under test. When the third OR indicates logical value 0, it means that the waveform of the signal under test for this cycle exists outside the eye mask.

Then, the computing section 60 determines whether all the third ORs corresponding to the measured cycles indicate logical value 0. The computing section 60 may have an OR circuit that further generates an OR of all the third ORs (hereinafter referred to as the fourth OR). When the fourth OR indicates logical value 0, it means that the waveforms of the signal under test for all the cycles exist outside the eye mask. The computing section 60 may determine that the device under test 200 is not defective when the fourth OR indicates logical value 0.

In addition, the computing section 60 may compute a degree of eye opening of the signal under test on the eye diagram in the direction of time (timing direction), based on the comparison result for each cycle, which is output from the expected value comparing circuit 40. For example, the computing section 60 detects the exclusive OR circuits 42, which output PASS for all the cycles of the signal under test. Then, the computing section 60 may compute the degree of eye opening in the direction of time by multiplying the number of the detected exclusive OR circuits 42 by the interval of the strobe signal.

Moreover, the computing section 60 may compute the degree of eye opening, based on the distribution of the strobe signals corresponding to the detected exclusive OR circuits 42. For example, the computing section 60 counts the number of sequential strobe signals in the direction of time, among the strobe signals corresponding to the exclusive OR circuits 42 which output PASS for all the cycles. The computing section 60 may compute the degree of eye opening of the signal under test in the direction of time by multiplying the counted value by the interval of the strobe signal.

Figure 2C:
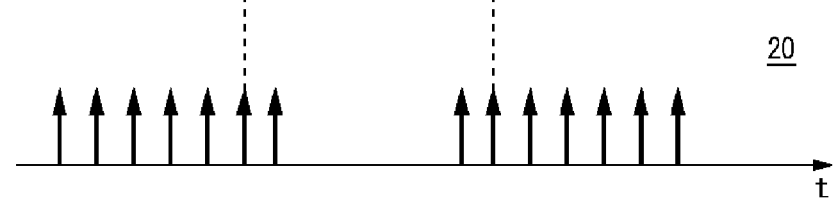
FIG. 2C shows another exemplary multi-strobe.

FIG. 2C shows another exemplary multi-strobe. The multi-strobe generating section 20 according to the present embodiment generates a plurality of strobe signals, including two strobe signals corresponding to the boundaries of the eye mask in the direction of time. Each interval between the strobe signals may not be even. In addition, as shown in FIG. 2C, the multi-strobe generating section 20 may generate the plurality of strobe signals arranged at even interval, at a front and a back boundary of the eye mask in the direction of time, respectively. That is, the strobe generating section may generate the plurality of strobe signals in the vicinity of both the front and back of boundaries of the eye mask in the direction of time, respectively. In addition, the multi-strobe generating section 20 may generate the strobe signals at even intervals, from the vicinity of the edge of the signal under test to the vicinity of the boundary of the eye mask.

In the case of general defect, the waveform of the signal under test is often generated inside the eye mask near the rising or the falling of the signal under test. The test apparatus 100 can detect the above-mentioned defect by measuring the vicinity of the edges of the signal under test and the boundaries of the eye mask.

In the above-described embodiment, it is preferred that the phase relationship between the signal under test and the multi-strobe does not change for each cycle. That is, it is preferred that the position of each strobe signal for each cycle does not change in terms of time for each cycle. In this case, the comparison result in a predetermined phase for each cycle is output from a predetermined exclusive OR circuit 42. That is, it does not change for each cycle that which of exclusive OR circuits 42 corresponds to the phase of the boundary of the eye mask in the direction of time. Therefore, the eye mask test as described above can be performed by pre-setting in the determination processing section 50 a certain exclusive OR circuit 42 corresponding to the boundary of the eye mask in the direction of time.

Meanwhile, when the phase relationship between the signal under test and the multi-strobe changes for each cycle, one exclusive OR circuit 42 corresponding to the boundary of the eye mask in the direction of time may not determined. In this case, the test apparatus 100 may perform the eye mask test, for each cycle of the signal under test, by measuring the time width over which the comparison results of the expected value comparing circuit 40 become continuously a predetermined result.

For example, the measuring unit 10, for each cycle of the signal under test, measures the time width over which the comparison results of the expected value comparing circuit 40 become continuously a predetermined result (for example, a value obtained by multiplying the number of the exclusive OR circuits 42 adjacent to each other which output PASSs by the interval of the strobe signal). Then, when the time width for each cycle is larger than the time width of the eye mask, the computing section 60 may determine that the device under test 200 is not defective.

Figure 3:
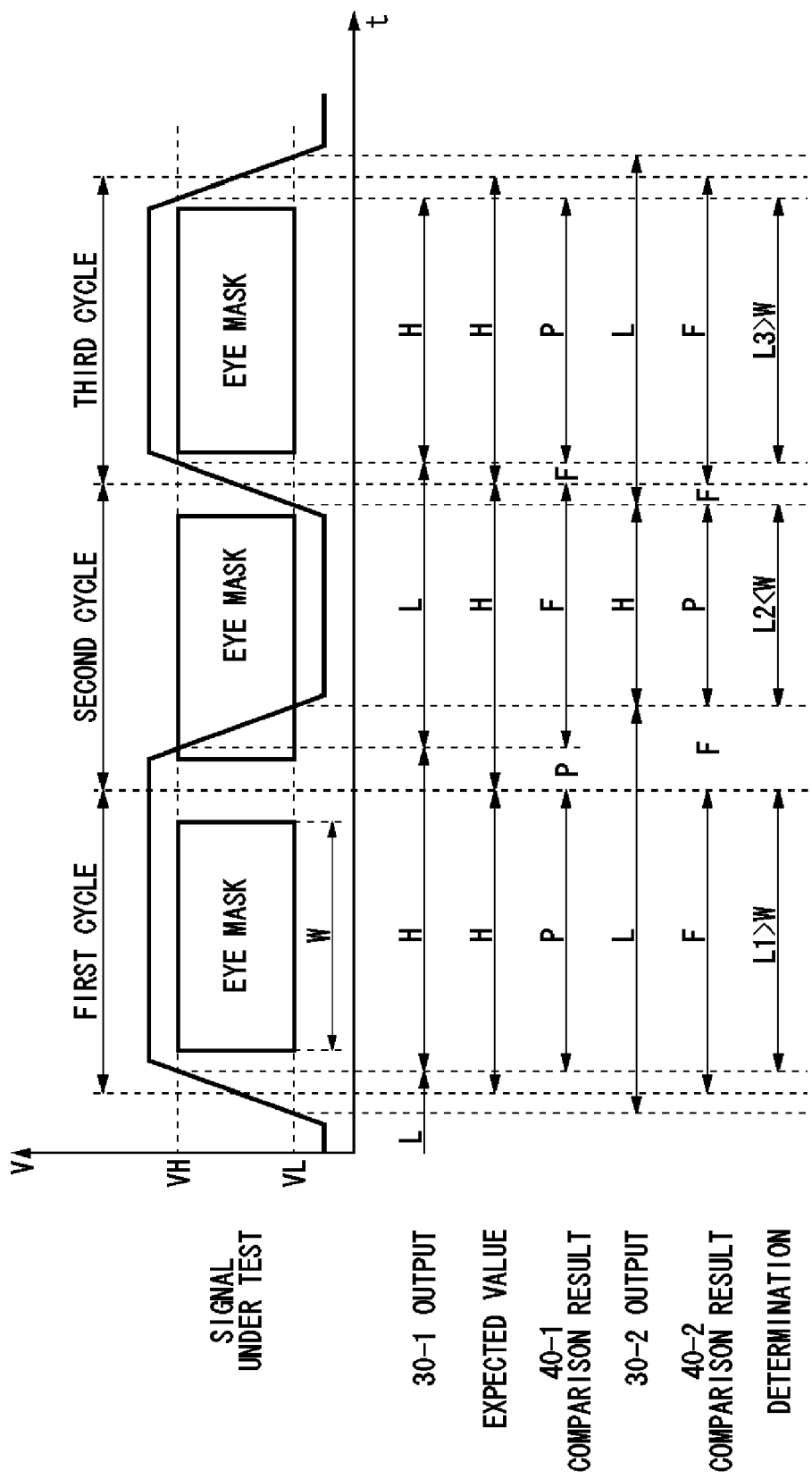
FIG. 3 is a timing chart explaining an exemplary operation of the test apparatus 100.

FIG. 3 is a timing chart explaining an exemplary operation of the test apparatus 100. The test apparatus 100 according to the present embodiment measures, for each cycle of the signal under test, the time width over which the comparison result of the expected value comparing circuit 40 become continuously a predetermined comparison result.

As described above, the upper limit and the lower limit of the eye mask in the direction of voltage are set to a first level comparator 12-1 and a second level comparator 12-2 as the first threshold VH and the second threshold VL. The first level comparator 12-1 outputs logical value H when the signal level of the signal under test is equal to or more than the first threshold VH. Meanwhile, the second level comparator 12-2 outputs logical value H when the signal level of the signal under test is equal to or less than the second threshold VL.

A first acquiring section 30-1 acquires the logical value output from the first level comparator 12-1 according to a plurality of strobe signals arranged at even intervals for each cycle of the signal under test. Next, the expected value generating section 16 generates an expected value for each cycle of the signal under test. The expected value generating section 16 may generate logical value H as the expected value, for all the cycles of the signal under test.

An expected value comparing circuit 40-1 compares the logical value output from the first acquiring section 30-1 with the expected value. In the present embodiment, the same expected value is input to each exclusive OR circuit 42 of the expected value comparing circuit 40. For each cycle of the signal under test, sections (P) in which the logical value output from the first acquiring section 30-1 corresponds to the expected value satisfies the definition of the upper limit of the eye mask in the direction of voltage for this cycle.

Similarly, a second acquiring section 30-2 acquires the logical value output from the second level comparator 12-2. In addition, a second expected value comparing circuit 40-2 compares the logical value output from the second acquiring section 30-2 with the expected value. The expected value supplied to the second expected value comparing circuit 40-2 may be the same as the expected value supplied to the first expected value comparing circuit. For each cycle of the signal under test, sections (P) in which the logical value output from the second acquiring section 30-2 corresponds to the expected value satisfies the definition of the lower limit of the eye mask in the direction of voltage for this cycle.

The determination processing section 50 measure, for each cycle of the signal under test, the time width over which the comparison results of the expected value comparing circuit 40 become continuously a predetermined comparison result. Here, the predetermined comparison result may mean that the comparison result output from the first expected value comparing circuit 40-1 or the second expected value comparing circuit 40-2 indicates PASS (P).

The determination processing section 50 may detect any one outputting PASS, of two exclusive OR circuits 42 which correspond to the same strobe signal in the first expected value comparing circuit 40-1 and the second expected value comparing circuit 40-2. Then, the determination processing section 50 may detect the number of detected exclusive OR circuits 42 adjacent to each other in the direction of time. Then, the determination processing section 50 may compute a value obtained by multiplying the number by the intervals of the strobe signals adjacent to each other in the direction of time, as the time width over which the comparison result become continuously a predetermined comparison result.

In the present embodiment, the exclusive OR circuits 42 adjacent to each other in each expected value comparing circuit 40 correspond to the strobe signals adjacent to each other in the direction of time. Therefore, time widths (L1, L2, L3) over which PASSs continue for each cycle can be obtained by detecting, for each cycle of the signal under test, the number of the exclusive OR circuits 42 adjacent to each other in which the first expected value comparing circuit 40-1 or the second expected value comparing circuit 40-2 outputs PASS and multiplying the detected number by the interval of the strobe signal.

As the second cycle in FIG. 3 when the waveform of the signal under test exists inside the eye mask, time width L2 is smaller than time width W of the eye mask. Therefore, when the time width (L1, L2, L3) for each cycle is larger than the time width W of the eye mask, it can be assumed that waveform of the signal under test for this cycle exists outside the eye mask.

The computing section 60 determines whether the time width (L1, L2, L3) computed by the determination processing section 50 is larger than the time width W of the eye mask, for every cycle (the first cycle, the second cycle and the third cycle in the present embodiment) of the measured signal under test. The computing section 60 may determine, for all the cycles, that the device under test 200 is not defective when the time width computed by the determination processing section 50 is larger than the time width of the eye mask.

Figure 4:
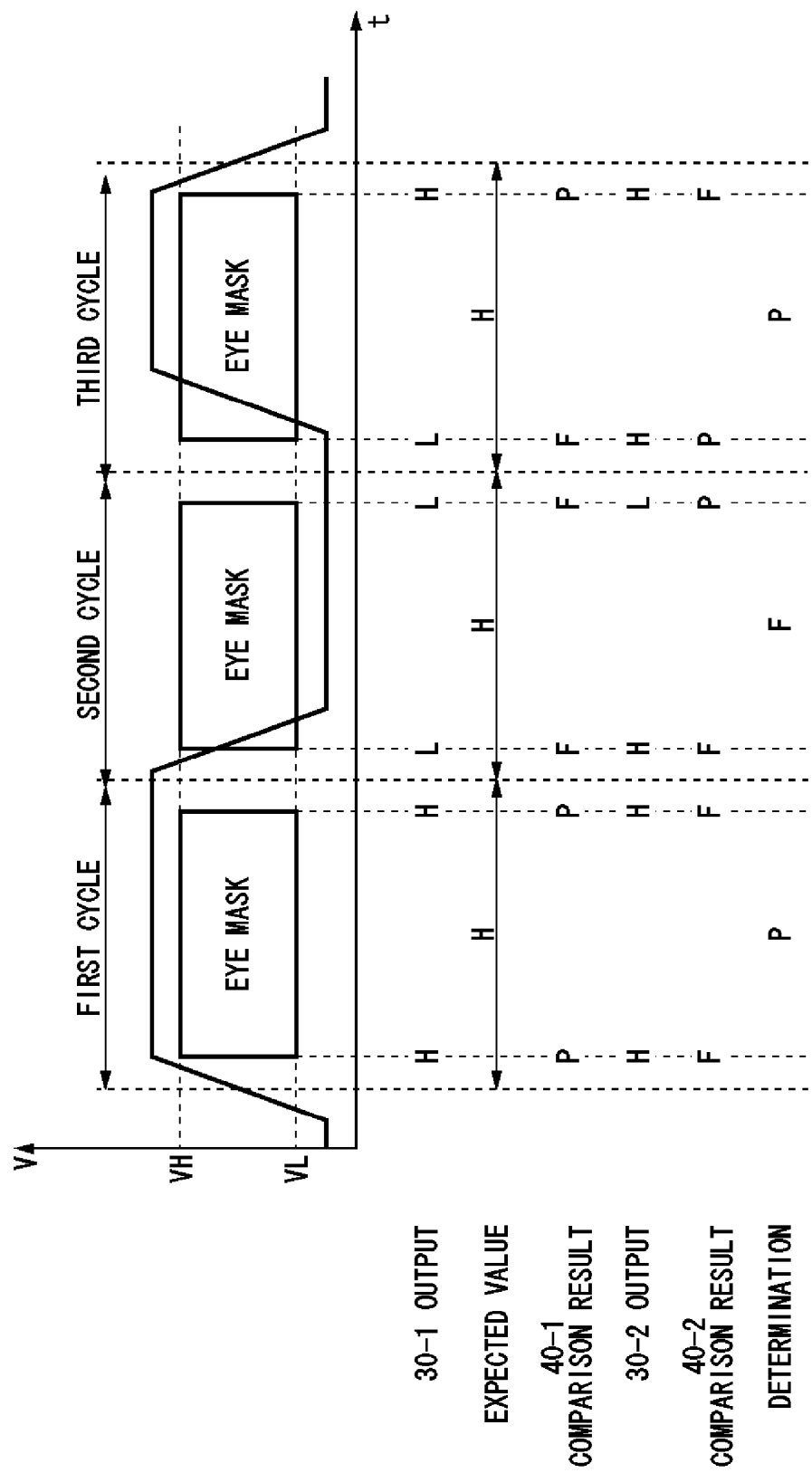
FIG. 4 is a timing chart showing another exemplary operation of the test apparatus 100.

FIG. 4 is a timing chart showing another exemplary operation of the test apparatus 100. The test apparatus 100 according to the present embodiment tests the device under test 200 by using two strobe signals corresponding to the front and back boundaries of the eye mask in the direction of time (hereinafter referred to as the first strobe signal and the second strobe signal). For example, the multi-strobe generating section 20 may generate the two strobe signals for each cycle of the signal under test. In addition, the multi-strobe generating section 20 may generate a plurality of strobe signals including the two strobe signals for each cycle of the signal under test, and the determination processing section 50 may extract and process the comparison result corresponding to the two strobe signals.

The determination processing section 50 determines, for each cycle of the signal under test, whether the comparison result of the expected value comparing circuit 40 is a predetermined comparison result. Here, the predetermined result may indicates that the comparison result output from the first expected value comparing circuit 40-1 or the second expected value comparing circuit 40-2 according to the first strobe signal is PASS (logical value 0), and that the comparison result output from the first expected value comparing circuit 40-1 or the second expected value comparing circuit 40-2 according to the timing of the second strobe signal is PASS.

For example, the determination processing section 50 may have one AND circuit that outputs an AND between the comparison result output from the first expected value comparing circuit 40-1 according to the first strobe signal and the comparison result output from the second expected value comparing circuit 40-2 according to the first strobe signal (hereinafter referred to as the first AND). In addition, the determination processing section 50 may have another AND circuit that outputs an AND between the comparison result output from the first expected value comparing circuit 40-1 according to the second strobe signal and the comparison result output from the second expected value comparing circuit 40-2 according to the second strobe signal (hereinafter referred to as the second AND).

Then, the determination processing section 50 determines, for each cycle, whether both the first AND and the second AND indicate PASS (logical value 0). The determination processing section 50 may have an OR circuit that outputs an OR of the first AND and the second AND (hereinafter referred to as the fifth OR). When the fifth OR indicates logical value 1, the waveform of the signal under test exists inside the eye mask for this cycle, at the timing of the boundary of the eye mask in the direction of time. For example, as shown in the second cycle of FIG. 4, when the boundary of the eye mask in the direction of time crosses the waveform of the signal under test, the fifth OR corresponding to this cycle indicates logical value 1.

The computing section 60 determines whether the fifth OR indicates logical value 0 for every cycle. The computing section 60 may have an OR circuit that further computes an OR of the fifth ORs for every cycle. Thus, the computing section 60 can determine whether there is any cycle over which the waveform of the signal under test crosses the boundary of the eye mask in the direction of time. When there is such cycle, it is determined that the eye opening of the signal under test is smaller than the eye mask.

Here, as the third cycle shown in FIG. 4, a case may be considered that the waveform of the signal under test exists inside the eye mask although the waveform of the signal under test does not cross the boundary of the eye mask in the direction of time. In this case, since the fifth OR indicates logical value 0, it can not be detected that the waveform of the signal under test exists inside the eye mask for this cycle.

However, in general, the phase of the edge of the signal under test gradually changes, there is a cycle before or after this cycle, over which the waveform of the signal under test crosses the boundary of the eye mask in the direction of time. Therefore, the computing section 60 can determine whether the waveform of the signal under test exists outside the eye mask for every cycle by determining whether any cycle for which the waveform of the signal under test crosses the boundary of the eye mask in the direction of time.

As described above, the test apparatus 100 according to the present embodiment can perform the eye mask test by easy processing. The eye mask test according to the present embodiment is particularly advantageous when an degree of eye opening is not computed, for example.

Figure 5:
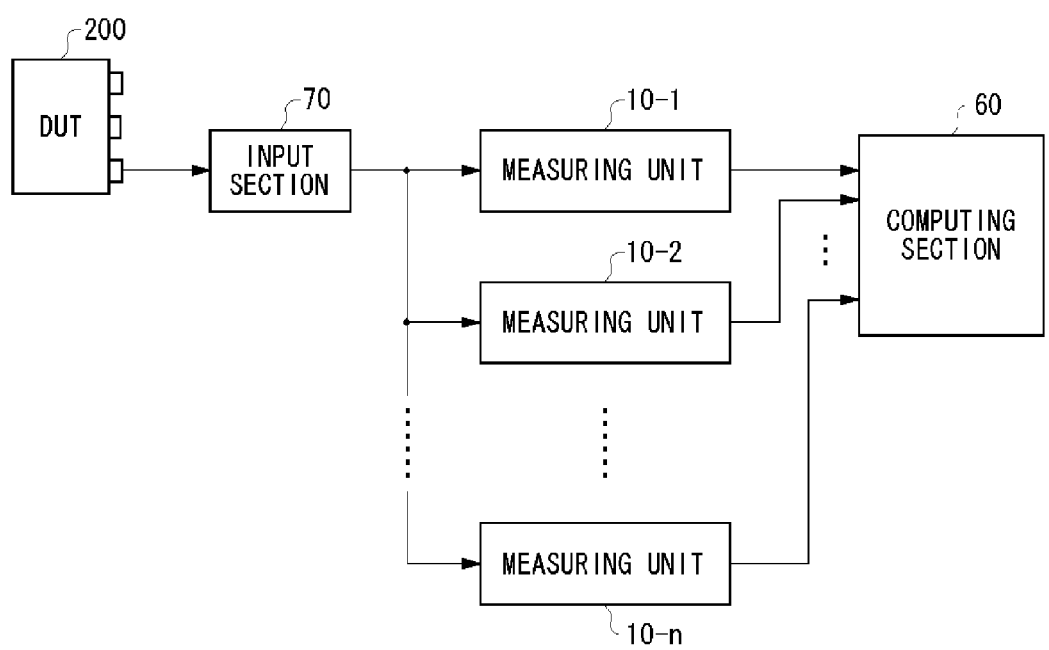
FIG. 5 shows another exemplary configuration of the test apparatus 100.

FIG. 5 shows another exemplary configuration of the test apparatus 100. The test apparatus 100 described with reference to FIG. 1 transforms the voltage level of the signal under test into three types of logical values by using two thresholds VH and VL. Meanwhile, the test apparatus 100 according to the present embodiment splits the signal under test and inputs the split signals under test to a plurality of signal measuring units 10 in parallel. At this time, the voltage level of the signal under test may be transformed into more types of logical values by setting different threshold level for each of the signal measuring unit 10.

Moreover, in a measuring unit 10-1 according to the present embodiment, the computing section 60 may be shared by each measuring unit 10. In addition, the test apparatus 100 further includes an input section 70 that splits the signal under test and inputs the split signals under test to a plurality of signal measuring unit 10. Thereby more various measurements can be performed.

For example, the first threshold and the second threshold are set such that the difference between the first threshold and the second threshold is different for each measuring unit 10 little by little. Then, each measuring unit 10 performs the eye mask test described with reference to FIG. 1 to FIG. 4. Then, the computing section 60 may compute the degree of eye opening of the signal under test in the direction of voltage, based on the first threshold value and the second threshold value set in the measuring unit 10 from which a result indicating that the eye opening of the signal under test is larger than the corresponding eye mask is obtained. The degree of eye opening may be computed by the computing section 60, based on the measurement result for each measuring unit 10 and each of the first threshold and the second threshold.

Moreover, the above-described eye mask test is performed with defining the rectangular eye mask test. Meanwhile, the test apparatus 100 as shown in FIG. 5 can perform the eye mask test with defining various shapes of eye masks.

Figure 6A:
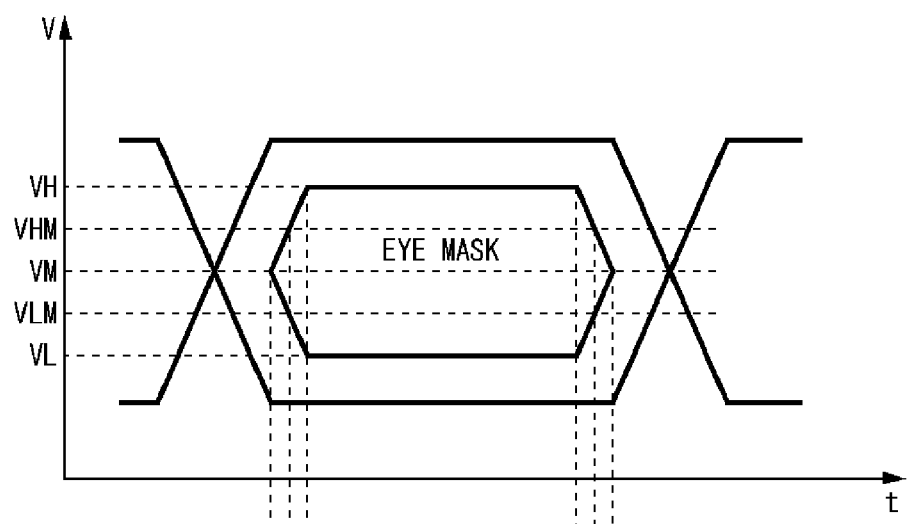
FIG. 6A shows an exemplary threshold set by the test apparatus 100 of FIG. 5.
Figure 6B:
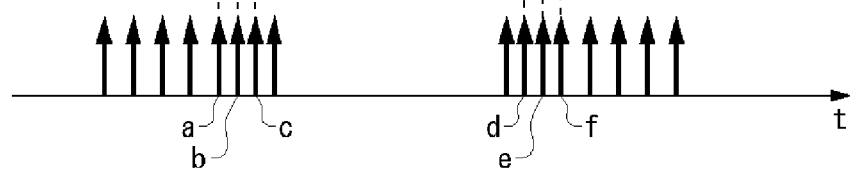
FIG. 6B shows an exemplary multi-strobe.

FIGS. 6A and 6B show an exemplary threshold set by the test apparatus 100 of FIG. 5. The test apparatus 100 according to the present embodiment performs the eye mask test by using a hexagonal eye mask, as shown in FIGS. 6A and 6B. This eye mask has the upper limit VH, the lower limit VL and the intermediate value VM in the direction of voltage. Here, the average between the upper limit VH and the intermediate value VM is VHM, and the average between the lower limit VL and the intermediate value VM is VLM. In addition, the position at which the eye mask indicates the upper limit is the same as the position at which the eye mask indicates the lower limit in the direction of time. Similarly, the position at which the eye mask indicates VHM is the same as the position at which the eye mask indicates VLM in the direction of time. The input section 70 according to the present embodiment may input the signal under test to three measuring units 10 in parallel.

The upper limit VH and the lower limit VL of the eye mask in the direction of voltage are set in the first measuring unit 10-1 as the first threshold and the second threshold. In addition, the first measuring unit 10-1 performs the above-described processing on the basis of the boundaries in the direction of time, at which the eye mask indicates the upper limit VH and the lower limit VL.

For example, when the process described with reference to FIG. 3 is performed, the determination processing section 50 may determine, for each cycle, whether the time width over which the expected value comparing circuit 40 outputs continuously a predetermined comparison result is larger than the time width over which the eye mask indicates the upper limit VH and the lower limit VL. In addition, when performing the process described with reference to FIG. 4, the multi-strobe generating section 20 may generate two strobe signals c and d corresponding to the boundaries at which the eye mask indicates the upper limit VH and the lower limit VL in the direction of time. The other processes in the first measuring unit 101 may be the same as the processes described with reference to FIG. 3 and FIG. 4.

In the second measuring unit 10-2, the intermediate value VM of the eye mask in the direction of voltage is set as the first threshold and the second threshold. In addition, in the second measuring unit 10-2, the above described processing is performed on the basis of the boundary in the direction of time, at which the eye mask indicates VM. For example, the second measuring unit 10-2 may perform the process described with reference to FIG. 3 by using the time width over which the eye mask indicates the intermediate value VM, and may perform the process with reference to FIG. 4 by using two strobe signals a and b which correspond to the boundaries in the direction of time, at which the eye mask indicates the intermediate value VM.

In the third measuring unit 10-3, the average VHM between the upper limit VH and the intermediate value VM is set as the first threshold, and the average VLM between the lower limit VL and the intermediate value VM is set as the second threshold. In addition, in the third measuring unit 10-3, the above described processes are performed on the basis of the boundaries in the direction of time, at which the eye mask indicates VHM and VLM. For example, the third measuring unit 10-3 may perform the process described with reference to FIG. 3 by using the time width over which the eye mask indicates VHM and VLM, and may perform the process with reference to FIG. 4 by using two strobe signals b and e which correspond to the boundaries in the direction of time, at which the eye mask indicates VHM and VLM.

Then, when the results in all the measuring units 10 indicate PASS (good) for every cycle of the signal under test, the computing section 60 may determine that the device under test 200 is not defective. Thus, the eye mask test by using the hexagonal eye mask as shown in FIGS. 6A and 6B can be performed.

Figure 7:
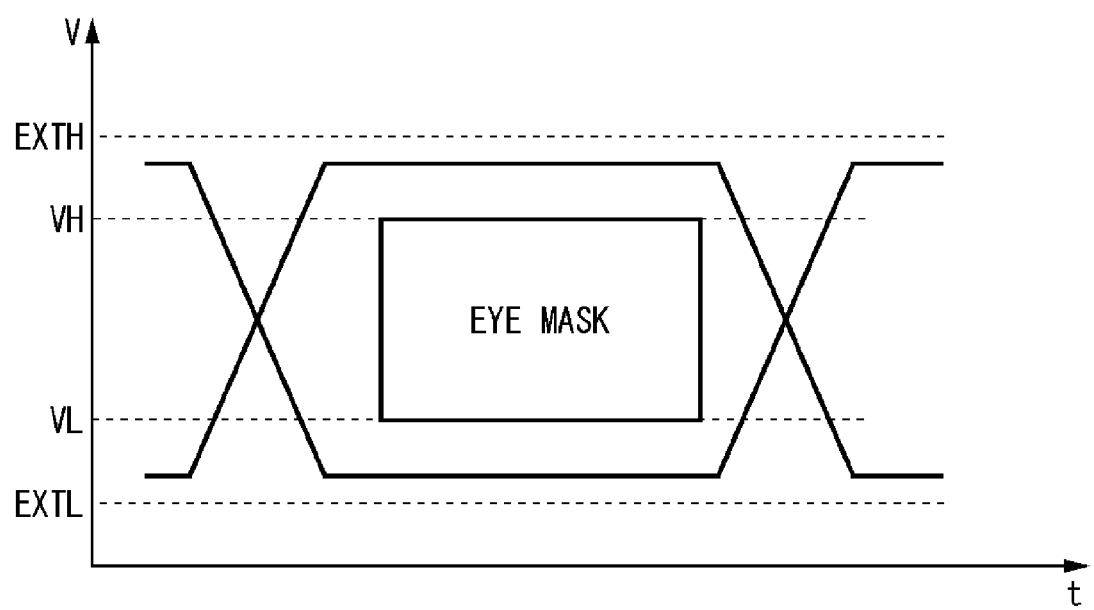
FIG. 7 shows another exemplary threshold set in the test apparatus 100 of FIG. 5.

FIG. 7 shows another exemplary threshold set in the test apparatus 100 of FIG. 5. The test apparatus 100 according to the present embodiment tests whether the voltage level of the signal under test falls within a predetermined voltage in parallel with the eye mask test. For example, the test apparatus 100 detects whether such as overshoot and under shoot of the signal under test fall within a predetermined voltage level. The input section 70 according to the present embodiment inputs in parallel the signals under test to two measuring units 10.

The first measuring unit 10-1 performs the eye mask test on the signal under test. In the first measuring unit 10-1, the upper limit VH and the lower limit VL of the eye mask in the direction of voltage are set as the first threshold and the second threshold, respectively. The first measuring unit 10-1 may be the same as the measuring unit 10 described with reference to FIG. 1 to FIG. 4.

In the second measuring unit 10-2, specified value EXTH and EXTL are set as the first threshold value and the second threshold value, respectively. The EXTH may be larger than the upper limit VH of the eye mask, while the specified value EXTL may be smaller than the lower limit VL of the eye mask.

The second measuring unit 10-2 determines whether the voltage level of the signal under test is equal to or lower than EXTH and is equal to or higher than EXTL for every cycle of the signal under test. For example, the expected value generating section 16 may output logical value L as the expected value for every cycle of the signal under test. Then, when all the exclusive OR circuits 42 output PASS (logical value 0) for every cycle of the signal under test, the determination processing section 50 and the computing section 60 may determine that the device under test 200 is not defective in this test. The test apparatus 100 may determine that the device under test 200, which passes both this voltage level test and the eye mask test is not defective.

Figure 8A:
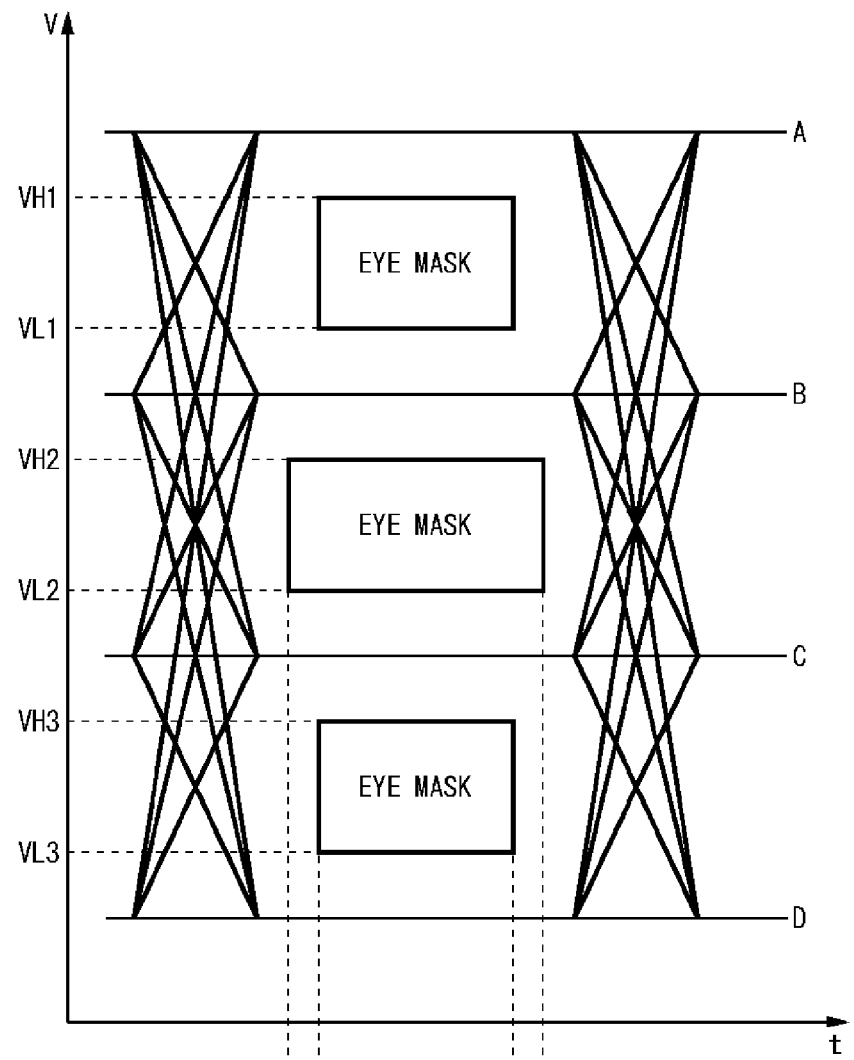
FIG. 8A shows another exemplary threshold set in the test apparatus 100 of FIG. 5.
Figure 8B:
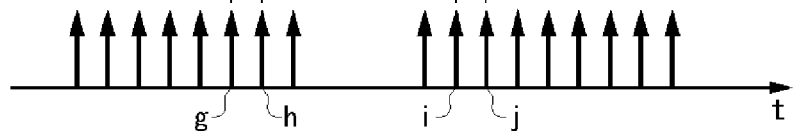
FIG. 8B shows an exemplary multi-strobe.

FIGS. 8A and 8B shows another exemplary threshold set in the test apparatus 100 of FIG. 5. The test apparatus 100 according to the present embodiment outputs a multi-valued transmission signal as a signal under test. For example, the signal under test may have any of four logical values A, B, C and D as shown in FIGS. 8A and 8B. The test apparatus 100 performs the eye mask test on the signal under test by using the first eye mask defined between logical values A and B, the second eye mask defined between logical values B and C, and the third eye mask defined between logical values C and D.

The input section 70 inputs in parallel signals under test to the number of measuring units 10 corresponding to the number of eye masks. The input section 70 according to the present embodiment inputs in parallel signals under test to three measuring units 10. In addition, the positions of the boundaries of the first eye mask and the third eye mask are the same in the direction of time.

In the first measuring unit 10-1, the upper limit VH 1 and the lower limit VL 1 of the eye mask in the direction of voltage are set as the first threshold and the second threshold, respectively. In addition, the first measuring unit 10-1 performs the above-described processes on the basis of the boundaries of the first eye mask in the direction of time, at which the first eye mask indicates the upper limit VH 1 and the lower limit VL 1.

For example, when the process with respect to FIG. 3 is performed, the determination processing section 50 may determine, for each cycle, whether the time width over which the expected value comparing circuit 40 continuously outputs a predetermined comparison result is larger than the time width over which the first eye mask indicates the upper limit VH 1 and the lower limit VL 1. In addition, when the process with respect to FIG. 4 is performed, the multi-strobe generating section 20 may generate two strobe signals h and i which correspond to the boundaries in the direction of time, at which the first eye mask indicates the upper limit VH 1 and the lower limit VL 1. The other processes in the first measuring unit 10-1 may be the same as the processes described with respect to FIG. 3 and FIG. 4.

In the second measuring unit 10-2, the upper limit VH 2 and the lower limit VL 2 of the second eye mask in the direction of voltage are set as the first threshold and the second threshold, respectively. In addition, the second measuring unit 10-2 performs the above-described processes on the basis of the boundaries in the direction of time, at which the second eye mask indicates VH 2 and VL 2. For example, the second measuring unit 10-2 may perform the process with reference to FIG. 3 by using the time width over which the second eye mask indicates VH 2 and VL 2, and also may perform the process described with reference to FIG. 4 by using two strobe signals g and j which correspond to the boundaries in the direction of time, at with the second eye mask indicates VH 2 and VL 2, respectively.

In the third measuring unit 10-3, the upper limit VH 3 and the lower limit VL 3 of the third eye mask in the direction of voltage are set as the first threshold and the second threshold, respectively. In addition, the third measuring unit 10-3 performs the above-described processes on the basis of the boundaries in the direction of time, at which the third eye mask indicates VH 3 and VL 3. For example, the third measuring unit 10-3 may perform the process described with reference to FIG. 3 by using the time width over which the third eye mask indicates VH 3 and VL 3, and also may perform the process with reference to FIG. 4 by using two strobe signals h and i which correspond to the boundaries in the direction of time, at which the third eye mask indicates VH 3 and VL 3.

Then, when the results in all the measuring units 10 indicate PASS for every cycle of the signal under test, the computing section 60 determines that the device under test 200 is not defective. Thus, the eye mask test by using the plurality of eye masks as shown in FIGS. 8A and 8B can be performed.

Figure 9:
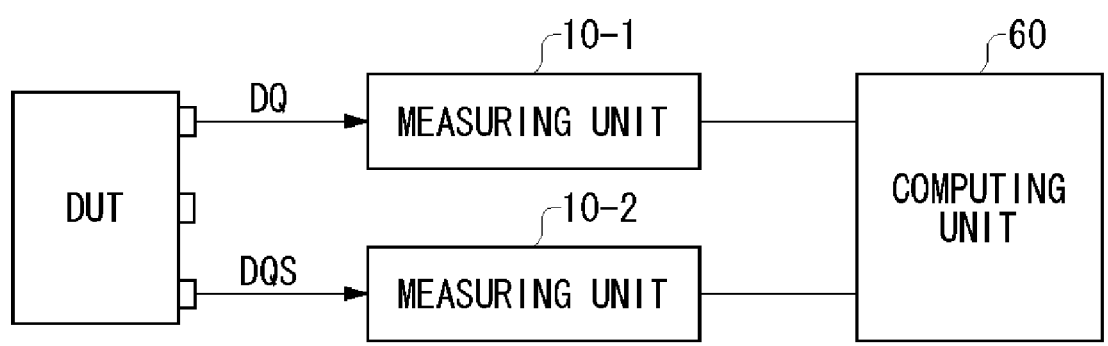
FIG. 9 shows another exemplary configuration of the test apparatus 100.

FIG. 9 shows another exemplary configuration of the test apparatus 100. The test apparatus 100 according to the present embodiment includes a signal measuring unit that computes a degree of eye opening of a signal under test DQ, and a clock measuring unit that measures jitter of a clock signal DQS in synchronism with the signal under test DQ. The device under test 200 may be a source synchronous device that synchronizes the signal under test DQ with the clock signal DQS and outputs the resultant. In the present embodiment, the first measuring unit 10-1 functions as a signal measuring unit that performs the eye mask test on the signal under test DQ, while the second measuring unit 10-2 functions as a clock measuring unit that measures jitter of the clock signal DQS.

The first measuring unit 10-1 may be the same as the measuring unit 10 described with reference to FIG. 1 to FIG. 4. In addition, as described with reference to FIG. 5 to FIG. 8B, the plurality of measuring units 10 may function as signal measuring units. Moreover, the first measuring unit 10-1 may compute the degree of eye opening of the signal under test DQ by the method described with reference to FIG. 2B, for example.

In the second measuring unit 10-2, a value which defines the voltage level of logic H and a value which defines the voltage level of logic L are set as the first threshold and the second threshold, respectively, for the clock signal. In addition, multi-strobe generating section 20 outputs the strobe signals at even intervals. It is preferred that the multi-strobe generating section 20 outputs the strobe signals at a certain interval smaller than the resolution with which jitter is measured. Thereby waveform data for each cycle of the clock signal can be obtained.

The computing section 60 detects an edge timing for each cycle of the clock signal, based on the waveform data. Then, the computing section 60 computes a quantity of jitter of the clock signal based on the dispersion of the edge timings for each cycle. For example, the computing section 60 may compute a peak-to-peak value of the dispersion of edge timings as the quantity of jitter of the clock signal.

Moreover, the computing section 60 computes an effective degree of eye opening for the source synchronous device by correcting the degree of eye opening measured by the first measuring unit 10-1, based on the quantity of jitter measured by the second measuring unit 10-2. For example, the computing section 60 may compute the effective degree of eye opening by subtracting the quantity of jitter from the degree of eye opening in the direction of voltage.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A test apparatus for performing, on a device under test, both i) an eye mask test for determining whether an eye opening of a signal under test is larger than a predefined eye mask and ii) a functional test different from the eye mask test, the apparatus comprising:
   a level comparing section that, during both the eye mask test and the functional test, receives a signal under test output from the device under test and outputs a logical value, the logical value indicating a comparison result obtained by comparing a signal level of the signal under test with preset first threshold and second threshold;
   an acquiring section that, during both the eye mask test and the functional test, acquires the logical value output from the level comparing section, according to a strobe signal supplied thereto;
   an expected value comparing circuit that, during both the eye mask test and the functional test, determines whether the logical value acquired by the acquiring section corresponds to a preset expected value; and
   a threshold control section that, i) during the eye mask test, sets an upper limit and a lower limit of a voltage of a predefined eye mask in the level comparing section as the first threshold and the second threshold, and, ii) during the functional test, prestores voltage levels defining high and low logic levels of the signal under test, as the first threshold and the second threshold, to be set in the level comparing section.

2. The test apparatus according to claim 1, further comprising:
   a multi-strobe generating section that, during the eye mask test, generates, for each cycle of the signal under test, a multi-strobe composed of a plurality of strobe signals with different phases, wherein
   the acquiring section acquires, during the eye mask test, for each cycle of the signal under test, the logical value output from the level comparing section at a plurality of timings corresponding to the plurality of strobe signals.

3. The test apparatus according to claim 2, further comprising
   a plurality of signal measuring units that receive a plurality of signals under test in parallel, wherein
   each of the signal measuring units has at least the level comparing section and the acquiring section.

4. The test apparatus according to claim 3, wherein
   the multi-strobe generating section generates the multi-strobe at least having two strobe signals corresponding to front and back boundaries of the eye mask in a direction of time.

5. The test apparatus according to claim 2, further comprising
   a computing section that computes a degree of eye opening of the signal under test, based on a result determined by the expected value comparing circuit.

6. The test apparatus according to claim 5, further comprising:
   a signal measuring unit that receives the signal under test; and
   a clock measuring unit that receives a clock signal output from the device under test, in synchronism with the signal under test, wherein
   each of the signal measuring unit and the clock measuring unit has at least the level comparing section and the acquiring section, and measures the signal under test and the clock signal in parallel,
   the threshold control section 1) sets the upper limit and the lower limit of the voltage of the eye mask, as the first threshold and the second threshold, respectively in the level comparing section of the signal measuring unit, and 2) sets values each defining H level and L level of the clock signal, as the first threshold and the second threshold, respectively in the level comparing section of the clock measuring unit, and the computing section computes jitter of the clock signal based on a measurement result from the clock measuring unit, and computes the degree of eye opening of the signal under test, further based on the jitter of the clock signal.

7. The test apparatus according to claim 2, wherein the expected value comparing circuit compares, for each cycle of the signal under test, the logical value acquired by the acquiring section with the preset expected value, and the test apparatus further comprises:

a determination processing section that determines, for each cycle of the signal under test, whether a time width over which comparison results output from the expected value comparing circuit continuously become a predetermined comparison result is larger than a time width of the eye mask; and a computing section that determines whether the time width over which the comparison results output from the expected value comparing section continuously become a predetermined comparison result is larger than the time width of the eye mask for every cycle of the signal under test which has been measured.

8. The test apparatus according to claim 2, wherein the multi-strobe generating section generates, for each cycle of the signal under test, two strobe signals corresponding to front and back boundaries of the eye mask in a direction of time, and the expected value comparing circuit compares, for each cycle of the signal under test, the logical value acquired by the acquiring section with the preset expected value, and wherein the test apparatus further comprises a computing section that determines whether the comparison result from the expected value comparing circuit is a predetermined comparison result for every cycle of the signal under test which has been measured.

9. The test apparatus according to claim 1 wherein the first threshold and the second threshold as set when an eye mask test is performed are fixed values.

10. A test apparatus for testing a device under test, comprising:

a plurality of signal measuring units arranged in parallel, each of the signal measuring units comprising:

a level comparing section that receives a signal under test output from the device under test and outputs a logical value, the logical value indicating a comparison result obtained by comparing a signal level of the signal under test with preset first threshold and second threshold; and an acquiring section that acquires the logical value output from the level comparing section, according to a strobe signal supplied thereto, the test apparatus further comprising:

an expected value comparing circuit that determines whether the logical value acquired by the acquiring section corresponds to a preset expected value;

a threshold control section that sets an upper limit and a lower limit of a voltage of a predefined eye mask in the level comparing section as the first threshold and the second threshold, when an eye mask test is performed for determining whether an eye opening of the signal under test is larger than the predefined eye mask; and an input section that splits the signal under test and inputs split signals under test to two or more signal measuring units, wherein the threshold control section sets values different from each another, as the first threshold and the second threshold, in two or more level comparing sections to which the split signals under test are input.

11. A method of testing a device under test for a test apparatus, the test apparatus for performing, on a device under test, i) both an eye mask test for determining whether an eye opening of a signal under test is larger than a predefined eye mask and ii) a functional test different from the eye mask test, the method comprising:

providing a level comparing section that, during both the eye mask test and the functional test, receives a signal under test output from the device under test and outputs a logical value, the logical value indicating a comparison result obtained by comparing a signal level of the signal under test with preset first threshold and second threshold;

providing an acquiring section that, during both the eye mask test and the functional test, detects the logical value output from the level comparing section, according to a strobe signal supplied thereto;

providing a determining section that, during both the eye mask test and the functional test, determines whether the logical value acquired by the acquiring section corresponds to a preset expected value; and setting, during the eye mask test, an upper limit and a lower limit of a voltage of the predefined eye mask, as the first threshold and the second threshold, in the level comparing section, and prestoring, during the functional test, voltage levels defining high and low logic levels of the signal under test, as the first threshold and the second threshold, in the level comparing section.

12. The method according to claim 11 wherein the first threshold and the second threshold as set when an eye mask test is performed are fixed values.

13. A test apparatus for testing a device under test, comprising:

a level comparing section that receives a signal under test output from the device under test and outputs a logical value, the logical value indicating a comparison result obtained by comparing a signal level of the signal under test with preset first threshold and second threshold;

an acquiring section that acquires the logical value output from the level comparing section, according to a strobe signal supplied thereto;

an expected value comparing circuit that determines whether the logical value acquired by the acquiring section corresponds to a preset expected value;

a threshold control section that sets an upper limit and a lower limit of a voltage of a predefined eye mask in the level comparing section as the first threshold and the second threshold, when an eye mask test is performed for determining whether an eye opening of the signal under test is larger than the predefined eye mask; and a computing section that, based on a result determined by the expected value comparing circuit, computes a degree of eye opening of the signal under test or determines whether the eye opening of the signal under test is larger than the predefined eye mask.

14. A method of testing a device under test for a test apparatus, the method comprising:

providing a level comparing section that receives a signal under test output from the device under test and outputs a logical value, the logical value indicating a comparison result obtained by comparing a signal level of the signal under test with preset first threshold and second threshold;

providing an acquiring section that detects the logical value output from the level comparing section, according to a strobe signal supplied thereto;

providing a determining section that determines whether the logical value acquired by the acquiring section corresponds to a preset expected value;

setting an upper limit and a lower limit of a voltage of a predefined eye mask, as the first threshold and the second threshold, in the level comparing section, when an eye mask test is performed for determining whether an eye opening of the signal under test is larger than a predefined eye mask; and, based on a result determined by the determining section, computing a degree of eye opening of the signal under test or determining whether the eye opening of the signal under test is larger than the predetermined eye mask.

15. A method of testing a device under test for a test apparatus, the method comprising:

providing a plurality of signal measuring units arranged in parallel, each of the signal measuring units including:

a level comparing section that receives a signal under test output from the device under test and outputs a logical value, the logical value indicating a comparison result obtained by comparing a signal level of the signal under test with preset first threshold and second threshold; and an acquiring section that detects the logical value output from the level comparing section, according to a strobe signal supplied thereto;

providing a determining section that determines whether the logical value acquired by the acquiring section corresponds to a preset expected value;

providing an input section that splits the signal under test and inputs split signals under test to two or more signal measuring units; and setting an upper limit and a lower limit of a voltage of a predefined eye mask, as the first threshold and the second threshold, in one of the level comparing sections, when an eye mask test is performed for determining whether an eye opening of the signal under test is larger than a predefined eye mask, wherein values different from each another are set as the first threshold and the second threshold in two or more level comparing sections to which the split signals under test are input.

* * * * *